United States Patent
Ross et al.

(10) Patent No.: US 11,671,080 B1
(45) Date of Patent: Jun. 6, 2023

(54) LEVEL SHIFTER WITH IMMUNITY TO STATE CHANGES IN RESPONSE TO HIGH SLEW RATE SIGNALS

(71) Applicant: Allegro MicroSystems, LLC, Manchester, NH (US)

(72) Inventors: Thomas Ross, West Lothian (GB); James McIntosh, East Lothian (GB)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/662,672

(22) Filed: May 10, 2022

(51) Int. Cl.
| H03K 19/00 | (2006.01) |
| H03K 3/037 | (2006.01) |
| H03K 5/1534 | (2006.01) |
| H03K 19/0185 | (2006.01) |
| H03K 17/687 | (2006.01) |

(52) U.S. Cl.
CPC ......... H03K 3/0375 (2013.01); H03K 5/1534 (2013.01); H03K 19/018507 (2013.01); H03K 19/018521 (2013.01); H03K 17/687 (2013.01)

(58) Field of Classification Search
CPC ... H03K 19/018507; H03K 19/018509; H03K 3/356113; H03K 17/687; H03K 5/1534; H03K 3/0375; H03K 19/018521
See application file for complete search history.

(56) References Cited

U.S. PATENT DOCUMENTS

| 4,695,744 | A | | 9/1987 | Giordano |
| 5,781,026 | A | * | 7/1998 | Chow ............... H03K 3/356147 326/26 |
| 5,917,359 | A | | 6/1999 | Fukunaga et al. |
| 6,002,290 | A | | 12/1999 | Avery et al. |
| 6,559,689 | B1 | | 5/2003 | Clark |
| 6,611,154 | B2 | * | 8/2003 | Grasso ............. H03K 19/00361 326/31 |
| 6,995,598 | B2 | * | 2/2006 | Hochschild ...... H03K 3/356113 327/333 |
| 7,466,182 | B2 | * | 12/2008 | Wang ................. H04L 25/0264 327/333 |

(Continued)

OTHER PUBLICATIONS

Office Action dated Sep. 25, 2020 for U.S. Appl. No. 16/907,511; 6 pages.

(Continued)

*Primary Examiner* — Tuan T Lam
(74) *Attorney, Agent, or Firm* — Daly, Crowley, Mofford & Durkee, LLP (57) ABSTRACT

An integrated circuit (IC) includes a level shifter coupled to receive a first supply voltage and a second supply voltage and configured to generate a first output signal and a second output signal in response to an input command signal and an edge detector configured to detect an edge on the second supply voltage and to sink a current from the level shifter in response to detection of the edge in order to prevent a change in logic state of the first output signal or the second output signal. The edge detector can include a positive edge detector configured to generate a positive edge signal in response to detection of a positive going edge of greater than a first predetermined slew rate and a negative edge detector configured to generate a negative edge signal in response to detection of a negative going edge of greater than a second predetermined slew rate.

11 Claims, 3 Drawing Sheets

(56) References Cited

U.S. PATENT DOCUMENTS

| | | | |
|---|---|---|---|
| 7,646,616 B2 | 1/2010 | Wekhande et al. | |
| 7,679,420 B1* | 3/2010 | Burkland | H03K 19/00361 |
| | | | 327/333 |
| 7,787,262 B2 | 8/2010 | Mangtani et al. | |
| 7,994,821 B1* | 8/2011 | Wang | H03K 3/356069 |
| | | | 326/83 |
| 8,610,462 B1* | 12/2013 | Wang | H03K 3/356113 |
| | | | 326/82 |
| 8,633,745 B1* | 1/2014 | Peterson | H03K 19/018521 |
| | | | 327/147 |
| 8,975,944 B2* | 3/2015 | Akahane | H03K 3/356182 |
| | | | 326/62 |
| 9,203,339 B2 | 12/2015 | Sato | |
| 9,214,884 B2 | 12/2015 | Sonoda et al. | |
| 9,294,084 B1 | 3/2016 | McIntosh et al. | |
| 9,325,317 B2* | 4/2016 | Akahane | H03K 19/018521 |
| 9,379,708 B2 | 6/2016 | Martin et al. | |
| 9,735,773 B2 | 8/2017 | McIntosh et al. | |
| 9,929,683 B2 | 3/2018 | Sonoda et al. | |
| 9,960,716 B2 | 5/2018 | Ambruson et al. | |
| 10,230,356 B2 | 3/2019 | Snowdon | |
| 10,979,051 B1* | 4/2021 | Ross | H03K 19/018521 |
| 2018/0287609 A1* | 10/2018 | Mallavajula | H03K 3/356017 |
| 2020/0021212 A1 | 1/2020 | Yamada et al. | |
| 2020/0028456 A1 | 1/2020 | Morioka et al. | |
| 2021/0409010 A1* | 12/2021 | Javvaji | H03K 19/018521 |

OTHER PUBLICATIONS

Response to Office Action dated Sep. 25, 2020 filed on Nov. 2, 2020 for U.S. Appl. No. 16/907,511; 13 pages.

Final Office Action dated Feb. 8, 2021 for U.S. Appl. No. 16/907,511; 8 pages.

Response to Office Action dated Feb. 8, 2021 filed on Feb. 19, 2021 for U.S. Appl. No. 16/907,511; 12 pages.

Notice of Allowance dated Feb. 26, 2021 for U.S. Appl. No. 16/907,511; 8 pages.

* cited by examiner

LEVEL SHIFTER WITH IMMUNITY TO STATE CHANGES IN RESPONSE TO HIGH SLEW RATE SIGNALS

FIELD

This disclosure relates generally to level shifters with immunity to state changes in response to high slew rate signals.

BACKGROUND

In general, a level shifter shifts a voltage from one voltage level to another voltage level. For example, a low-to-high voltage level shifter shifts from a low voltage level a higher voltage level.

SUMMARY

Described herein are circuits and techniques for preventing a level shifter output signal from changing state in response to a high slew rate signal on the high voltage, power supply rail. To this end, an edge detector detects high slew rate signals on the power supply rail and initiates a high current pulse boost in response to such detection.

According to the disclosure, an integrated circuit (IC) includes a level shifter coupled to receive a first supply voltage and a second supply voltage and configured to generate a first output signal and a second output signal in response to an input command signal and an edge detector configured to detect an edge on the second supply voltage and to sink a current from the level shifter in response to detection of the edge to prevent a change logic state of the first output signal or the second output signal. When the input command signal is logical high, the first output signal is logical low and the second output signal is logical high and, when the input command signal is logical low, the first output signal is logical high and the second output signal is logical low.

Features may include one or more of the following individually or in combination with other features. The edge detector can include a positive edge detector configured to generate a positive edge signal in response to detection of a positive going edge of greater than a first predetermined slew rate and a negative edge detector configured to generate a negative edge signal in response to detection of a negative going edge of greater than a second predetermined slew rate. The positive edge detector can include a current mirror comprising a first path comprising a current source configured to source a predetermined current and a second path coupled to the first path and through which a mirrored version of the predetermined current flows, wherein the second path comprises a positive edge detector output node at which the positive edge signal is provided, wherein the positive edge detector output node is pulled to a low voltage level in the absence of a positive going edge on the second supply voltage of the first predetermined slew rate and a capacitor coupled between the second supply voltage and the second path of the current mirror, wherein a current flowing through the capacitor when a positive going edge on the second supply voltage meets or exceeds the first predetermined slew rate causes the positive edge detector output node to be pulled to a high voltage level, wherein the capacitor and the predetermined current establish the first predetermined slew rate. The negative edge detector can include a current mirror comprising a first path comprising a current sink configured to sink a predetermined current and a second path coupled to the first path and through which a mirrored version of the predetermined current flows, wherein the second path comprises a negative edge detector output node at which the negative edge detector signal is provided, wherein the negative edge detector output node is pulled to a high voltage level in the absence of a negative going edge on the second supply voltage of the second predetermined slew rate and a capacitor coupled between the second supply voltage and the second path of the current mirror, wherein a current flowing through the capacitor when a negative edge on the second supply voltage meets or exceeds the second predetermined slew rate causes the negative going edge detector output node to be pulled to a low voltage level, wherein the capacitor and the predetermined current establish the second predetermined slew rate.

The IC can further include a logic circuit having an OR gate with inputs coupled to receive the positive edge signal and the negative edge signal and configured to generate a boost signal. The logic circuit can be further coupled to receive a pulse signal indicative of a change of logic state of the input command signal, wherein the boost signal is further responsive to the pulse signal. The logic circuit can include a first OR gate having a first input responsive to the positive edge signal, a second input responsive to the negative edge signal, and an output at which an edge detection signal is provided and a second OR gate having a first input responsive to the edge detection signal and a second input responsive to the pulse signal, and an output at which the boost signal is provided.

The level shifter can include a first leg having a node at which the first output signal is provided, a first series-coupled transistor responsive to the input command signal, and a first mirroring transistor of a current mirror and a second leg having a node at which the second output signal is provided, a second series-coupled transistor responsive to an inverted version of the input command signal, and a second mirroring transistor of the current mirror, wherein, when the input command signal is logical high, the first series-coupled transistor is on and sinks current through the first leg and, when the input command signal is logical low, the second series-coupled transistor is on and sinks current through the second leg. The level shifter can further include a first current pulse transistor configured to turn on when the input command signal transitions to logical high and a second current pulse transistor configured to turn on when the input command signal transitions to logical low. The first current pulse transistor can be controlled by the input command signal and the boost signal and the second current pulse transistor can be controlled by an inverted version of the input command signal and the boost signal.

Also described is a method of providing, with a level shifter, coupled to receive a first supply voltage and a second supply voltage and configured to generate a first output signal and a second output signal in response to an input command signal, wherein, when the input command signal is logical high, the first output signal logical low and the second output signal is logical high and, when the input command signal is logical low, the first output signal is logical high and the second output signal is logical low and detecting an edge on the second supply voltage and supplying a current to the level shifter in response to detection of the edge to prevent a change in logic state of the first output signal or the second output signal.

Features may include one or more of the following individually or in combination with other features. Detecting the edge on the second supply voltage can include generating a positive edge signal in response to detection of a positive going edge of greater than a first predetermined slew rate; and generating a negative edge signal in response to detection a negative going edge of greater than a second predetermined slew rate. The method can further include generating, with an OR gate, a boost signal in response to the positive edge signal or the negative edge signal, wherein the boost signal is indicative of detection of the positive going edge of greater than the first predetermined slew rate or of the negative going edge of greater than the second predetermined slew rate. The method can further include providing the level shifter with a first leg at which the first output signal is provided, providing the level shifter with a second leg coupled to the first leg and at which the second output signal is provided, sinking current from the first leg of the level shifter when the input command signal transitions to logical high, and sinking current from the second leg of the level shifter when the input command signal transitions to logical low. The method can further include sinking current from the first leg of the level shifter when the input command signal transitions to logical high and when the boost signal transitions to indicate detection of the positive going edge of greater than the first predetermined slew rate or detection of the negative going edge of greater than the second predetermined slew rate and sinking current from the second leg of the level shifter when the input command signal transitions to logical low and when the boost signal transitions to indicate detection of the positive going edge of greater than the first predetermined slew rate or detection of the negative going edge of greater than the second predetermined slew rate.

Also described is apparatus including level shifting means coupled to receive a first supply voltage and a second supply voltage and configured to generate a first output signal and a second output signal in response to an input command signal, wherein, when the input command signal is logical high, the first output signal is logical low and the second output signal is logical high and, when the input command signal is logical low, the first output signal is logical high and the second output signal is logical low, means for detecting an edge on the second supply voltage of at least a predetermined slew rate, and means for preventing the first output signal or the second output signal from transitioning in response to detection of the edge.

Features may include one or more of the following individually or in combination with other features. The edge detecting means can include means for detecting a positive going edge of at least a first predetermined slew rate and means for detecting a negative going edge of at least a second predetermined slew rate. The level shifting means can include a first leg having a first node at which the first output signal is provided and a second leg having a second node at which the second output signal is provided, wherein the preventing means comprises means for pulling down either the first node or the second node.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Described herein are circuits and techniques to prevent an output signal of a low to high voltage level shifter from erroneously changing state in response to high slew rate signals on the high voltage, power supply rail. To this end, an edge detector detects high slew rate signals on the power supply rail and initiates a current pulse boost in response to such detection.

Figure 1:
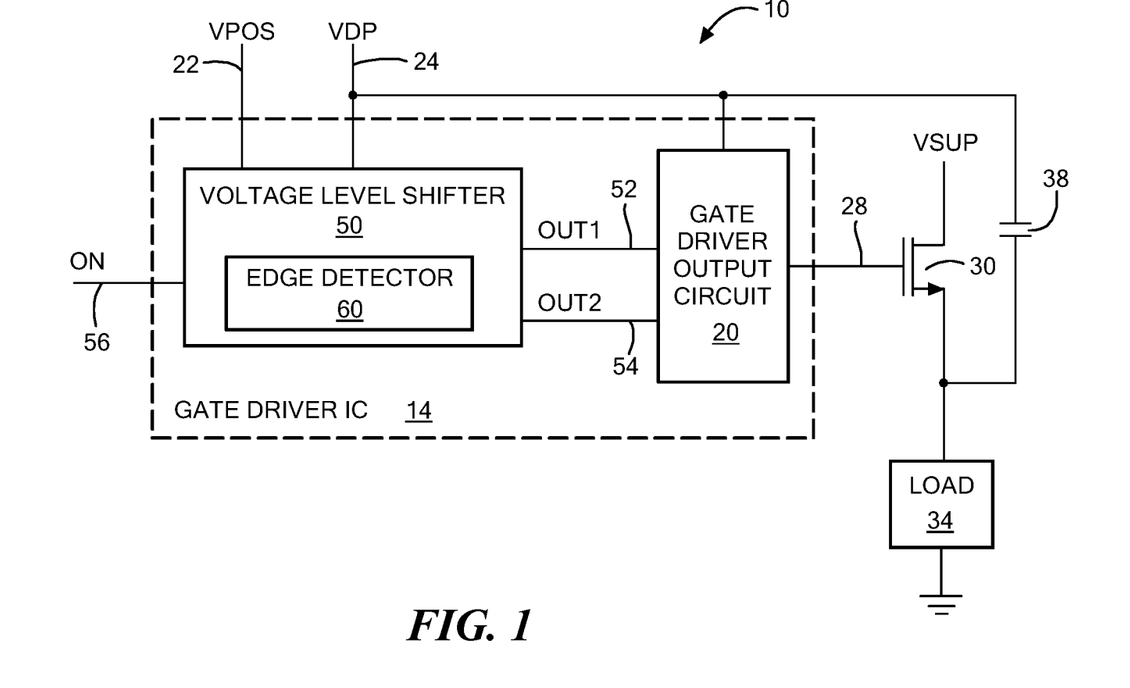
FIG. 1 is a block diagram of a system including a level shifter including an edge detector configured to prevent a change in logic state of an output signal of the level shifter according to the disclosure.

Referring to FIG. 1, a system 10 includes a level shifter 50 having an edge detector 60 configured to prevent a change in logic state of an output signal OUT1 52 or OUT2 54 of the level shifter in response to high slew rate signals on a power supply VDP 24. The level shifter 50 can be coupled to receive a first supply voltage VPOS 22 and a second supply voltage VDP 24 and configured to generate a first output signal OUT1 52 and a second output signal OUT2 54 in response to an input command signal ON 56. In an example embodiment, when the input command signal ON is logical high, the first output signal OUT1 is logical low and the second output signal OUT2 is logical high and, when the input command signal ON is logical low, the first output signal OUT1 is logical high and the second output signal OUT2 is logical low.

The edge detector 60 is configured to detect an edge of a predetermined slew rate on the second supply voltage VDP 24 and initiate a current pulse boost by sinking a current from the level shifter 50 in response to detection of the edge in order to prevent a change in logic state of the first output signal OUT1 or the second output signal OUT2. In particular, whichever level shifter output signal OUT1, OUT2 is at a logic low level can be maintained at the logic low level by sinking current from that output signal node.

The first supply voltage VPOS 22 can represent a relatively low voltage domain, such as at logic levels of between approximately 0V and 5V, and the second supply voltage VDP 24 can represent a high voltage domain in some embodiments, to which the input command signal ON is shifted. While the second supply voltage VDP is described as being a relatively high voltage domain in example embodiments, it will be appreciated by those of ordinary skill in the art that other voltage levels can be used in the level shifter 50.

The example system 10 can be a gate driver circuit for driving a transistor 30 and can include a gate driver IC 14 incorporating the level shifter 50 and a gate driver output circuit 20. Gate driver IC 14 can generate a gate drive signal 28 to control the transistor 30, here a MOSFET, as may be coupled between a supply voltage VSUP and a load 34. A capacitor 38 can be coupled between the second supply voltage VDP 24 and the load 34, as shown. In the example system 10, the input command signal ON 56 can be a control input signal, having a level that is relatively low compared to the output signals OUT1, OUT2. In one particular example, if the input command signal ON is logical high, the voltage may be about 5 volts while the output signal OUT2 is logical high, but at about 100 volts, for example. Thus, the level shifter 50 shifts from the low voltage input signal ON to a high voltage output signal OUT2. The differential voltage OUT1-OUT2 54 can be applied to a latch (as may form part of the gate driver output circuit 20) in the higher, output VDP voltage domain in order to be processed by further circuitry.

As an example, transistor 30 that can be part of a half-bridge, or other switch arrangement designed for various applications. For example, in an automotive power application, the load 34 can be a high-power inductive load, such as a coil of a Brushless DC (BLDC) motor. In a further example, the load 34 may be another power transistor, which would then form a half-bridge configuration.

The system can operate with a supply voltage VSUP having a range on the order of between 20V to 90V (as may be provided by a battery) and a bootstrap capacitor 38 can provide a voltage above the supply voltage VSUP as may be required to power transistor 30 which can be an N-channel metal oxide semiconductor field effect transistor NMOS FET, as shown.

It will be appreciated by those of ordinary skill in the art that while the example system 10 is a gate driver, other systems requiring a level shifter can benefit from use of the described level shifter 50.

Figure 2:
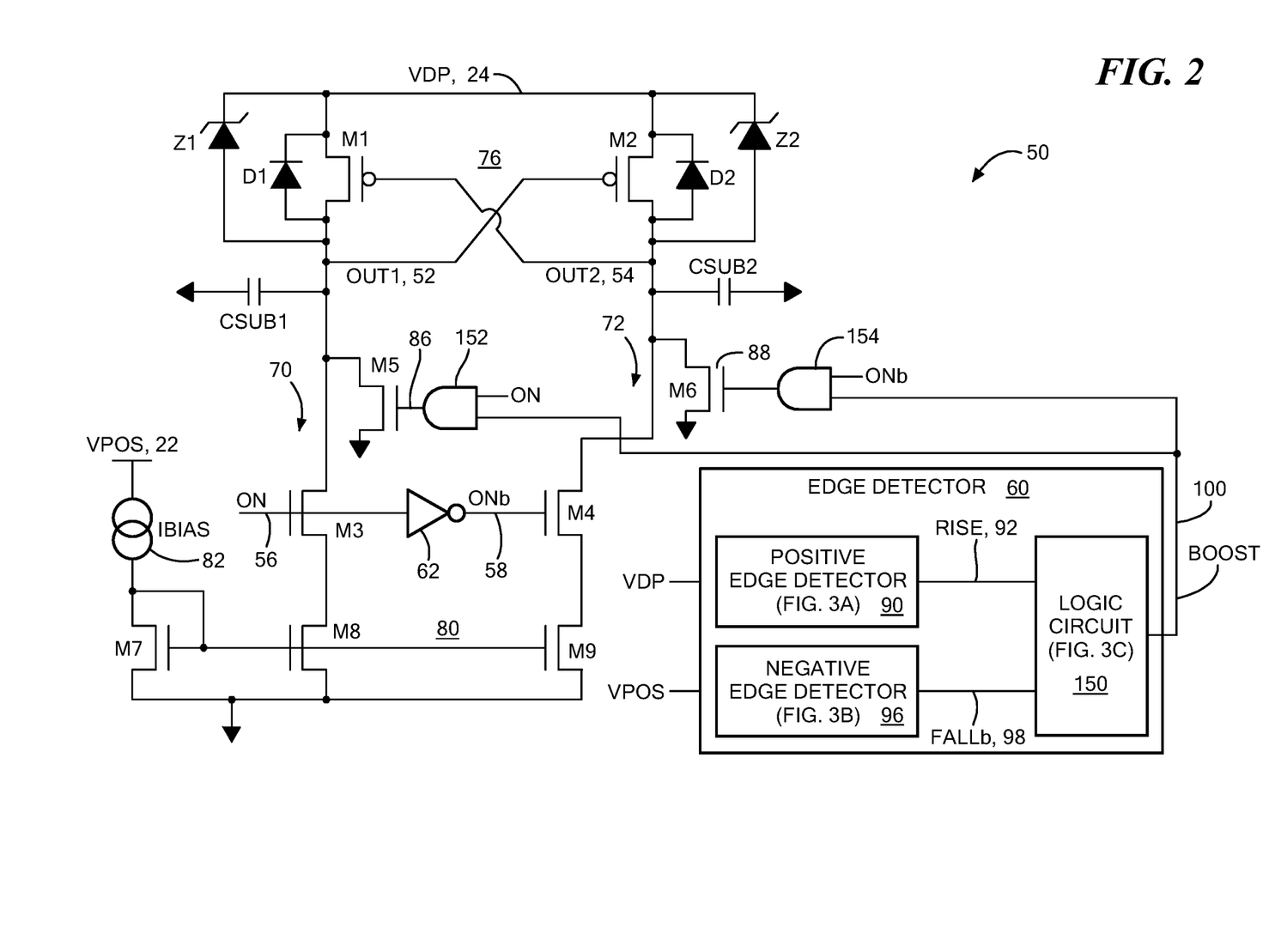
FIG. 2 is a simplified schematic of the level shifter including an edge detector of FIG. 1.

Referring also to FIG. 2, the level shifter 50 is shown in greater detail to include edge detector 60 and to generate first and second output signals OUT1 52, OUT2 54, each having a level based on a logic level of input command signal ON 56, but referenced to a high voltage domain established by the second supply voltage VDP 24. In an initial state, as an example, when the input command signal ON is logical high, the first output signal OUT1 is logical low and the second output signal OUT2 is logical high. Conversely, when the input command signal ON is logical low, the first output signal OUT1 is logical high and the second output signal OUT2 is logical low.

Level shifter 50 includes a first leg 70 at which the first output signal OUT1 is provided and a second leg 72 at which the second output signal OUT2 is provided, with the first and second legs coupled together by a cross-coupled latch 76 and current mirror 80. The first leg 70 includes a node (here the drain of PMOS FET M1) at which the first output signal OUT1 is provided, a first series-coupled transistor M3 responsive to the input command signal ON, and a first mirroring transistor M8 of current mirror 80. A second leg 72 of the level shifter 50 includes a node (here the drain of PMOS FET M2) at which the second output signal OUT2 is provided, a second series-coupled transistor M4 responsive to an inverted version ONb 58 of the input command signal ON (as may be generated by an inverter 62), and a second mirroring transistor M9 of the current mirror 80.

Current mirror 80 includes, in addition to transistors M8 and M9, a current path with a diode-coupled transistor M7 in series with a bias current source IBIAS 82, as shown. Based on the size ratio of transistors M8 and M9 to M7, transistors M8 and M9 carry a current that is a multiple of IBIAS. The bias current IBIAS 82 can be selected to optimize power consumption versus resilience to VDP movement without affecting level shifter output state. In particular, the higher the bias current IBIAS 82, the more resilient to VDP movement (i.e., the more responsive to VDP changes), but the higher the power consumption. In an example embodiment, the bias current IBIAS 82 can be within a range of between 5 µA and 20 µA.

The PMOS latch 76 includes PMOS FETs M1, M2, cross-coupled such that the drain of transistor M1 is coupled to the gate of transistor M2 and the drain of transistor M2 is coupled to the gate of transistor M1. The source terminals of transistors M1, M2 are coupled to the high voltage rail VDP. Diodes D1 and D2 are the body diodes of FETs M1 and M2, respectively. Zener diodes Z1, Z2 coupled across respective FETs M1, M2 clamp the voltage so as to protect the transistors M1, M2 by preventing their drains from going too far below the supply voltage VDP. Latch 76 operates to maintain the state of the output signals OUT1, OUT2 under static operation conditions (e.g., in the absence of high slew rate disturbances on the supply voltage VDP).

Capacitances CSUB1 and CSUB2 represent parasitic capacitances between the level shifter output nodes OUT1, 52 and OUT2, 54 and the integrated circuit substrate and any logic level (non-VDP) metal. Transistors M3 and M4 can be cascode transistors that prevent logic level circuitry from being exposed to potentially damaging high voltage levels.

In operation, in the initial state when the input command signal ON is logical high, the first series-coupled transistor M3 is on and sinks current through the first leg 70 and, when the input command signal ON is logical low, the second series-coupled transistor M4 is on and sinks current through the second leg 72. With this arrangement, at any given time, current flows either through the first level shifter leg 70 or through the second level shifter leg 72.

A transistor M5 is coupled to the first level shifter leg 70 and a transistor M6 is coupled to the second level shifter leg 72, as shown. Transistors M5 and M6 generate relatively short duration, relatively large amplitude current pulses in response to state changes of the input command signal ON in order to flip the PMOS latch 76 quickly (i.e., in order to change the relative voltage levels of the level shifter output signals OUT1, OUT2). Only one of the transistors M5, M6 is on at a given time. Transistors M5 and M6 can be low on-resistance switches or can be current-limited (i.e., can include resistors in current sources or current sinks, for example). Following a short duration current pulse by transistor M5 or transistor M6, the respective transistor turns off, thereby returning the level shifter 50 to a low current state in order to minimize power dissipation.

More particularly, during operation, when the logical state of the input command signal ON transitions, whichever leg 70, 72 of the level shifter 50 is turned on (i.e., is sinking current) will have a short duration, large current pulse introduced by the respective transistor M5, M6 in order to quickly change the voltage level of the respective first or second output signal OUT1, OUT2. For example, when the input command signal ON transitions from a logical low to logical high, the first series-coupled transistor M3 turns on to sink current through the first leg 70. In response to this input command signal transition, transistor M5 turns on to sink a short duration, large current pulse from leg 70 so as to quickly pull the first output signal OUT1 low. Conversely, when the input command signal ON transitions from a logical high to a logical low, the second series-coupled transistor M4 turns on to sink current through the second leg 72. In response to this input command signal transition, transistor M6 turns on to sink a short duration, large current pulse from leg 72 so as to quickly pull the second output signal OUT2 low.

According to the disclosure, transistors M5, M6 additionally generate short duration, relatively large amplitude current pulses in response to detection of high slew rate signals on the second supply voltage rail VDP. To this end, control signals 86, 88 of transistors M5, M6, respectively, are based, not only on input command signal ON (or its inverse ONb) but also on a BOOST signal 100 that is generated by the edge detector 60, as will be described. This arrangement is advantageous, because the presence of high slew rate signals on the supply voltage rail VDP can cause an output signal OUT1, OUT2 of the level shifter to erroneously change state (i.e., to lose its state).

More particularly, the parasitic capacitances CSUB1 and CSUB2 form a divider between VDP 24 referred circuitry to these capacitances. Unless capacitances CSUB1 and CSUB2 are very small in absolute terms and in terms of imbalance, then during high frequency ringing events on the supply voltage VDP for example, the latch 76 can flip state unintentionally. To prevent unintentional latch flipping, careful layout techniques should be used, as may including shielding of the level shifter high-voltage domain wiring and circuitry from the substrate. The level shifter, even without the VDP edge detector 60, can prevent the latch flipping if the static bias current in M8 and M9 is large enough. On positive VDP edges (i.e., +ve), the level shifter is able to prevent the latch flipping if the imbalance in delta current between CSUB1 and CSUB2 is below a certain value. For example, consider a supply voltage ringing event in which the latch output state is retained upon the occurrence of a first VDP positive edge. A subsequent negative edge can cause the latch state to be lost due to both output signal OUT1 and output signal OUT2 going high. Upon the occurrence of a further positive edge, in order to flip the latch, the output signal OUT2 has to go low before output signal OUT1. At the point of erroneous state flipping of the latch, (CSUB2−CSUB1)*dVDP/dt=IBIAS. We assume here CSUB2>CSUB1 in this example. The delta current should be less than IBIAS as shown; otherwise, the latch 76 could flip. The relationship between frequency and peak slew-rate for a given sinusoidal frequency is dVDP/dt (max) =2*pi*A*frequency, where A is the single-ended amplitude of the sinusoidal ringing. As an example, for differential capacitance of 10 fF and dVDP/dt=200 MV/s, IDELTA=2 uA. Thus, IBIAS needs to be greater than 2 uA in order to prevent the latch flipping on positive edges. 200 MV/s corresponds to a frequency of dVDP/(dt*2*pi*A)=636 kHz for dVDP/dt=200 MV/s and A=50V. On negative VDP edges (i.e., −ve), the level shifter is able to prevent the latch flipping if IBIAS>CSUB1*dVDP/dt when considering the first leg 70 and IBIAS>CSUB2*dVDP/dt when considering the second leg 72. For example, a fast negative edge on VDP 24 can cause current to flow from CSUB1 and CSUB2 to VDP. Considering the latch state when the input command signal ON is high, M1 is off and M2 is on, so that current IBIAS flows through the first level shifter leg 70. In the presence of the fast negative edge on VDP, in order to maintain the state of output signal OUT1 lower than output signal OUT2, CSUB1*dVDP/dt must be less than IBIAS (presuming that IBIAS flows through current mirror transistor M8). The corresponding frequency is f=dVDP/(dt*2*pi*A). As an example, for CSUB1=CSUB2=50 fF and dVDP/dt=200 MV/s, I=10 uA. Thus, IBIAS needs to be greater than 10 uA in order to prevent the latch flipping on negative edges. 200 MV/s corresponds to a frequency of dVDP/(dt*2*pi*A)=636 kHz for dVDP/dt=200 MV/s and A=50V.

At frequencies above which the latch 76 can flip state incorrectly, the edge detector 60 can prevent this from happening. The range of "high frequency" events on VDP above which the detector 60 is able to prevent the latch flipping is bounded on the high end by the response time of the circuitry itself and the sizing of the boost current $I_{BOOST}$ (i.e., current through transistor M5 or M6). The boost current needs to be greater than the current which flows in CSUB1 or CSUB2 whenever VDP 24 has a negative edge event. For example, if dVDP/dt=10 GV/s and CSUB1=CSUB2=100 fF then $I_{BOOST}$ needs to be greater than 1 mA in order to prevent the latch flipping. The boost current needs to be greater than the delta current which flows between CSUB1 and CSUB2 whenever VDP has a positive edge event. For example, if dVDP/dt=10 GV/s, CSUB1=100 fF and CSUB2=110 fF then $I_{BOOST}$ needs to be greater than 10 GV/s*10 fF=100 uA in order to prevent the latch flipping. Choice of the boost current is dictated by the larger required current. The range of "high frequency" events on VDP above which the detector 60 is able to prevent the latch flipping is bounded on the low end by the sizing of IBIAS 82 in the latch circuit. The detector 60 should overlap with the lower-end VDP oscillation frequencies that the latch is resilient to, ensuring the level shifter state is constant from DC up to the higher-bound frequencies dictated by either the response time of the edge detector 60 or by the choice of $I_{BOOST}$. Such high slew rate waveforms on the power supply rail 24 can be due to high-frequency ripple (e.g., in an automotive system) during and after a bootstrapped supply transition for a high-side FET driver. To ensure that the detector 60 responds to a minimum required slew-rate on VDP, the size of IDET1 and IDET2 can be chosen, for given values of C1 and C2. For example, if it were known that the level shifter were to lose state for slew-rates above 1 GV/s, one might design the lowest detectable slew rate to be 0.5 GV/s. If C1 and C2 were chosen to be 100 fF then this means IDET1=IDET2=100 fF*0.5 GV/s=50 uA.

In order to avoid such undesirable latch flipping scenarios, the edge detector 60 detects fast edges on VDP 24 and boosts the current to the active leg 70, 72 of the level shifter 50 (i.e., the leg that is on and sinking current) in order to retain the state of the respective output signal OUT1, OUT2.

The boosted current introduced by transistors M5, M6 can be significantly higher than the bias current IBIAS 82. It will be appreciated by those of ordinary skill in the art that the higher the boosted current, the greater the slew rate (i.e., dVDP/dt) for which the level shifter can retain its state.

Edge detector 60 includes a positive edge detector 90 configured to generate a positive edge signal RISE 92 in response to detection of a positive going edge of greater than a first predetermined slew rate and a negative edge detector 96 configured to generate a negative edge signal FALLb 98 in response to detection of a negative going edge of greater than a second predetermined slew rate. The edge detector 60 further includes a logic circuit 150 coupled to receive the positive edge signal RISE 92 and the negative edge signal FALLb 98 and configured to generate an output signal BOOST 100 indicative of detection of either a positive going edge of greater than the first predetermined slew rate or detection of a negative going edge of greater than the second predetermined slew rate.

In an example, transistors M1, M2 are n-channel MOSFETs or NMOS FETs and transistors M3-M9 are p-channel MOSFETs or PMOS FETs, as shown.

Figure 3A:
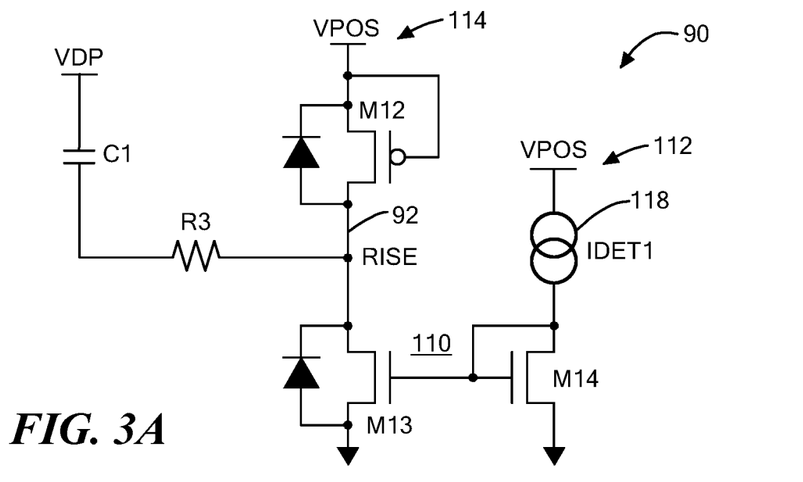
FIG. 3A shows an example positive edge detector of FIG. 2.
Figure 3B:
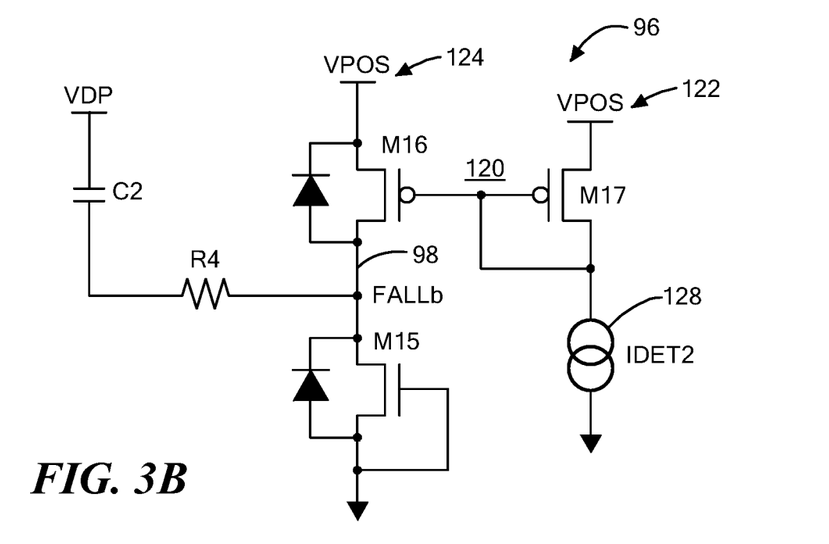
FIG. 3B shows an example negative edge detector of FIG. 2.
Figure 3C:
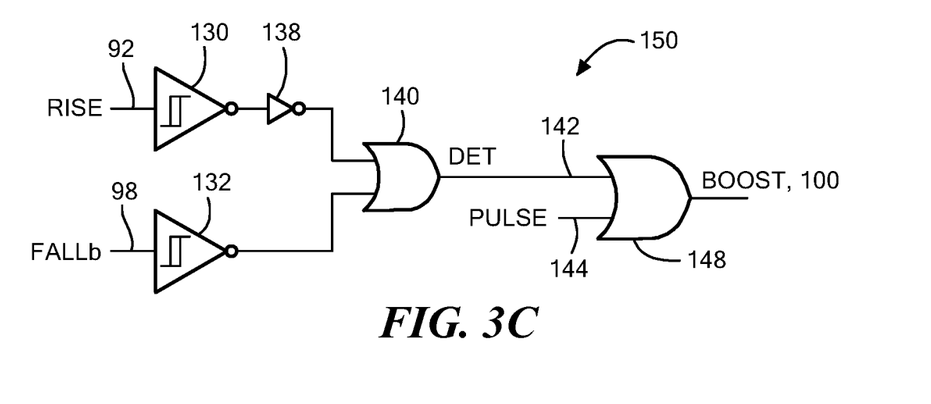
FIG. 3C shows an example logic circuit of the edge detector of FIG. 2.

An example positive edge detector 90 is shown in FIG. 3A and an example negative edge detector 96 is shown in FIG. 3B. An example logic circuit 150 is shown in FIG. 3C.

Referring to FIG. 3A, an example positive edge detector 90 includes a current mirror 110 having a transistor M14 in a first path 112 and a mirroring transistor M13 in a second path 114. The first path 112 further includes a first current source 118 configured to source a first predetermined current IDET1. A mirrored version of the first predetermined current IDET1 flows through transistor M13 in the second path 114, which second path further includes a diode-connected transistor M12 and an output node at which the positive edge signal RISE 92 is provided. A capacitor C1 is coupled between the second supply voltage VDP and the positive edge detector output node by a current-limiting resistor R3.

In operation, in the absence of a positive going edge on the second supply voltage VDP of the first predetermined slew rate, the positive edge detector output signal 92 is pulled to ground by conducting transistor M13. When a positive going edge on the second supply voltage VDP meets or exceeds the first predetermined slew rate, a current flowing through the capacitor C1, as may be given by: C1*dVDP/dt, where dVDP/dt is the slew rate of the VDP supply, becomes greater than the first predetermined current IDET1 and flows through the body diode of M12 to a high level, thereby causing the positive edge detector output signal 92 to be pulled to a high voltage level. A high voltage level on the positive edge detector output signal 92 indicates detection of a positive edge on VDP of at least the first predetermined slew rate.

The first predetermined slew rate is established by the size of the capacitor C1, resistor R3, and the level of the first predetermined current IDET1 118. For example, the minimum detectable rising slew rate can be tuned by selection of the first predetermined current IDET1 118. Within the response time of the circuitry, the maximum rising slew rate for which the level shifter 50 retains state is proportional to the boost current sunk by transistor M5, which can be tuned or made proportional to the first predetermined slew rate for power minimization.

In an example, a capacitance of capacitor C1 can be 100 fF and the first predetermined current IDET1 can be 5 µA in order to detect a rising slew rate of greater than or equal to 50 MV/s (i.e., for the RISE signal 92) to go high. The capacitance at the positive edge detector output node 92 should be much less than the capacitance of capacitor C1 or else some capacitive division can occur, which undesirably raises the minimum detection amplitude. Capacitance on the RISE signal node 92 is also undesirable as it can slow the detector down.

When the rising edge event stops, the RISE signal 92 should not take long to go low again in order to avoid unnecessary power dissipation. The fall time of the RISE signal is based, in part on the first predetermined current IDET1 118, the capacitance of capacitor C1, and the capacitance of the RISE signal node 92.

Referring to FIG. 3B, an example negative edge detector 96 includes a current mirror 120 having a transistor M17 in a first path 122 and a mirroring transistor M16 in a second path 124. The first path 122 further includes a second current source 128 (here coupled to sink current) configured to sink a second predetermined current IDET2. A mirrored version of the second predetermined current IDET2 flows through transistor M16 in the second path 124, which second path further includes a diode-connected transistor M15 and an output node at which the negative edge signal FALLb 98 is provided. A capacitor C2 is coupled between the second supply voltage VDP and the negative edge detector output node by a current-limiting resistor R4.

In operation, in the absence of a negative going edge on the second supply voltage VDP of the second predetermined slew rate, the negative edge detector output signal 98 is pulled to a high voltage level of VPOS by conducting transistor M16 (presuming that the logic level voltage VPOS is negligible as compared to the voltage level of VDP). When a negative edge on the second supply voltage meets or exceeds the second predetermined slew rate, a current flowing through the capacitor C2, as may be given by: C2*dVDP/dt, where dVDP/dt is the slew rate of the VDP supply, becomes greater than the second predetermined current IDET2 and flows through the body diode of M15, thereby causing the negative edge detector output signal 98 to be pulled to a low level. A low voltage level on the negative edge detector output signal 98 indicates detection of a negative edge on VDP of at least the second predetermined slew rate.

The second predetermined slew rate is established by the size of the capacitor C2, resistor R4, and the level of the second predetermined current IDET2 128. For example, the minimum detectable falling slew rate can be tuned by selection of the second predetermined current IDET2 128. Within the response time of the circuitry, the maximum falling slew rate for which the level shifter 50 retains state is proportional to the boost current sunk by transistor M6, which can be tuned or made proportional to the second predetermined slew rate for power minimization.

In an example, a capacitance of capacitor C2 can be 100 fF and the second predetermined current IDET2 can be 5 µA in order to detect a falling slew rate of greater than or equal to 50 MV/s (i.e., for the FALLb signal 98) to go low. The capacitance at the negative edge detector output node 98 should be much less than the capacitance of capacitor C2 or else some capacitive division can occur, which undesirably raises the minimum detection amplitude. Capacitance on the FALLb signal node 98 is also undesirable as it can slow the detector down.

When the falling edge event stops, the FALLb signal 98 should not take long to go high again in order to avoid unnecessary power dissipation. The rise time of the FALLb signal is based, in part on the second predetermined current IDET2 128, the capacitance C2, and the capacitance of the FALLb signal node 98.

It will be appreciated by those of ordinary skill in the art that the first predetermined slew rate detected by the positive edge detector 90 and the second predetermined slew rate detected by the negative edge detector 96 can be the same or different. For example, the minimum slew rate detectable by the positive edge detector 90 (i.e., the first predetermined slew rate) can be tuned by selection of the first current source IDET1 118 and the minimum slew rate detectable by the negative edge detector 96 can be tuned by selection of the second current source IDET2 128.

The first and second predetermined slew rates can be optimized so that they are high enough to prevent the high current pulse operation so often that higher power consumption would result. On the other hand, such first and second predetermined slew rates should not be so high that the latch 76 flips erroneously due to the effects of differential capacitance.

Referring also to FIG. 3C, an example logic circuit 150 includes Schmitt trigger inverters 130, 132 coupled to receive the positive edge signal RISE 92 and the negative edge signal FALLb 98, respectively. An output of Schmitt trigger inverter 130 is further inverted by an inverter 138 for coupling to an input of an OR gate 140. A second input of OR gate 140 is coupled to receive an output of the Schmitt trigger inverter 132. Thus, an output of OR gate 140, as may provide a DET signal 142 is asserted (i.e., at a logic high level) if either the RISE signal 92 is high, indicating detection of a positive going edge on the VDP voltage or if the FALLb signal 98 is low, indicating detection of a negative going edge on the VDP voltage.

A further OR gate 148 is coupled to receive the DET signal 142 and a PULSE signal 144. The PULSE signal 144 can take the form of a pulse that indicates a change in polarity (i.e., a state transition) of the input command signal ON. In an example embodiment, the PULSE signal 144 can have a duration on the order of 50 ns. The edge detector output signal BOOST 100 can be provided at the output of OR gate 148 and is thus asserted for a short duration (based on the duration of the PULSE signal 144, a high level of the RISE signal 92, or a low level of the FALLb SIGNAL 98).

Referring again to FIG. 2, transistor M5 is controlled by an output signal 86 of an AND gate 152 having a first input responsive to the input command signal ON and a second input responsive to the BOOST signal 100. Transistor M6 is controlled by an output signal 88 of an AND gate 154 having a first input responsive to inverted version of the input command signal ONb and a second input responsive to the BOOST signal 100.

With this arrangement, transistor M5 is turned on and sinks current from the first level shifter leg 70 whenever the input command signal ON transitions to a logic high level and remains on for a relatively short duration when dictated only by the PULSE signal 144 or for a duration dictated by how long the RISE signal 92 remains at a logic high level or the FALLb signal 98 remains at a logic low level. Transistor M6 is turned on and sinks current from the second level shifter leg 72 whenever the inverted version of the input command signal ONb transitions to a logic high level and remains on for a relatively short duration when dictated only by the PULSE signal 144 or for a duration dictated by how long the RISE signal 92 remains at a logic high level or the FALLb signal 98 remains at a logic low level.

In this way, the level shifter 50 retains state during power supply rail movement above a predetermined slew rate, regardless of designed for parasitic level shifter capacitance (e.g., CSUB1, CSUB2). This advantage is significant in certain applications such as in high-side motor drivers for which the bootstrap voltage (e.g., VDP) can move up and down at very high slew rates and can have a lot of ringing on power nodes. For example, this circuitry could prevent a power FET (e.g., FET 30 of FIG. 1) from being commanded off when the user or system commands that the FET be on, even when exposed to high slew-rates and ringing on power supply rails. Further, this benefit is achieved in a manner that can be designed to detect different slew rates for rising versus falling edges as described above.

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. An integrated circuit (IC) comprising:
   a level shifter coupled to receive a first supply voltage and a second supply voltage and configured to generate a first output signal and a second output signal in response to an input command signal, wherein, when the input command signal is logical high, the first output signal is logical low and the second output signal is logical high and, when the input command signal is logical low, the first output signal is logical high and the second output signal is logical low;
   an edge detector configured to detect an edge on the second supply voltage and to sink a current from the level shifter in response to detection of the edge to prevent a change in logic state of the first output signal or the second output signal, wherein the edge detector composes a positive edge detector configured to generate a positive edge signal in response to detection of a positive going edge of greater than a first predetermine slew rate and a negative edge detector configured to generate a negative edge signal in response to detection of a negative going edge of greater than a second predetermined slew rate; and
   a logic circuit having an OR gate with inputs coupled to receive the positive edge signal and the negative edge signal and configured to generate a boost signal.

2. The IC of claim 1, wherein the positive edge detector comprises:
   a current mirror comprising:
      a first path comprising a current source configured to source a predetermined current; and
      a second path coupled to the first path and through which a mirrored version of the predetermined current flows, wherein the second path comprises a positive edge detector output node at which the positive edge signal is provided, wherein the positive edge detector output node is pulled to a low voltage level in the absence of a positive going edge on the second supply voltage of the first predetermined slew rate; and
   a capacitor coupled between the second supply voltage and the second path of the current mirror, wherein a current flowing through the capacitor when a positive going edge on the second supply voltage meets or exceeds the first predetermined slew rate causes the positive edge detector output node to be pulled to a high voltage level, wherein the capacitor and the predetermined current establish the first predetermined slew rate.

3. The IC of claim 1, wherein the negative edge detector comprises:
   a current mirror comprising:
      a first path comprising a current sink configured to sink a predetermined current; and
      a second path coupled to the first path and through which a mirrored version of the predetermined current flows, wherein the second path comprises a negative edge detector output node at which the negative edge detector signal is provided, wherein the negative edge detector output node is pulled to a high voltage level in the absence of a negative going edge on the second supply voltage of the second predetermined slew rate; and
   a capacitor coupled between the second supply voltage and the second path of the current mirror, wherein a current flowing through the capacitor when a negative edge on the second supply voltage meets or exceeds the second predetermined slew rate causes the negative going edge detector output node to be pulled to a low voltage level, wherein the capacitor and the predetermined current establish the second predetermined slew rate.

4. The IC of claim 1, wherein the logic circuit is further coupled to receive a pulse signal indicative of a change of logic state of the input command signal, wherein the boost signal is further responsive to the pulse signal.

5. The IC of claim 4, wherein the logic circuit comprises:
a first OR gate having a first input responsive to the positive edge signal, a second input responsive to the negative edge signal, and an output at which an edge detection signal is provided; and
a second OR gate having a first input responsive to the edge detection signal and a second input responsive to the pulse signal, and an output at which the boost signal is provided.

6. The IC of claim 1, wherein the level shifter comprises:
a first leg comprising a node at which the first output signal is provided, a first series-coupled transistor responsive to the input command signal, and a first mirroring transistor of a current mirror; and
a second leg comprising a node at which the second output signal is provided, a second series-coupled transistor responsive to an inverted version of the input command signal, and a second mirroring transistor of the current mirror;
wherein, when the input command signal is logical high, the first series-coupled transistor is on and sinks current through the first leg and, when the input command signal is logical low, the second series-coupled transistor is on and sinks current through the second leg.

7. The IC of claim 6, wherein the level shifter further comprises:
a first current pulse transistor configured to turn on when the input command signal transitions to logical high; and
a second current pulse transistor configured to turn on when the input command signal transitions to logical low.

8. The IC of claim 7, wherein the first current pulse transistor is controlled by the input command signal and the boost signal and wherein the second current pulse transistor is controlled by an inverted version of the input command signal and the boost signal.

9. A method comprising:
providing, with a level shifter, coupled to receive a first supply voltage and a second supply voltage and configured to generate a first output signal and a second output signal in response to an input command signal, wherein, when the input command signal is logical high, the first output signal logical low and the second output signal is logical high and, when the input command signal is logical low, the first output signal is logical high and the second output signal is logical low; and
detecting an edge on the second supply voltage, comprising:
generating a positive edge signal in response to detection of a positive going edge of greater than a first predetermined slew rate; and
generating a negative edge signal in response to detection a negative going edge of greater than a second predetermined slew rate;
generating, with an OR gate, a boost signal in response to the positive edge signal or the negative edge signal, wherein the boost signal is indicative of detection of the positive going edge of greater than the first predetermined slew rate or of the negative going edge of greater than the second predetermined slew rate; and
supplying a current to the level shifter in response to detection of the edge to prevent a change in logic state of the first output signal or the second output signal.

10. The method of claim 9, further comprising:
providing the level shifter with a first leg at which the first output signal is provided;
providing the level shifter with a second leg coupled to the first leg and at which the second output signal is provided;
sinking current from the first leg of the level shifter when the input command signal transitions to logical high; and
sinking current from the second leg of the level shifter when the input command signal transitions to logical low.

11. The method of claim 10, further comprising:
sinking current from the first leg of the level shifter when the input command signal transitions to logical high and when the boost signal transitions to indicate detection of the positive going edge of greater than the first predetermined slew rate or detection of the negative going edge of greater than second predetermined slew rate; and
sinking current from the second leg of the level shifter when the input command signal transitions to logical low and when the boost signal transitions to indicate detection of the positive going edge of greater than the first predetermined slew rate and detection of the negative going edge of greater than the second predetermined slew rate.

* * * * *

UNITED STATES PATENT AND TRADEMARK OFFICE
CERTIFICATE OF CORRECTION

PATENT NO. : 11,671,080 B1
APPLICATION NO. : 17/662672
DATED : June 6, 2023
INVENTOR(S) : Thomas Ross et al.

It is certified that error appears in the above-identified patent and that said Letters Patent is hereby corrected as shown below:

In the Specification

Column 2, Line 56 delete "signal logical" and replace with --signal is logical--.

Column 3, Line 3 delete "detection a" and replace with --detection of a--.

Column 5, Line 10 delete "that can" and replace with --can--.

Column 10, Line 36 delete "capacitance C2," and replace with --capacitance of capacitor C2,--.

Column 12, Line 11 delete "composes" and replace with --comprises--.

Column 13, Line 48 delete "signal logical" and replace with --signal is logical--.

Column 14, Lines 9-10 delete "detection a" and replace with --detection of a--.

Signed and Sealed this
Seventh Day of May, 2024

*Katherine Kelly Vidal*

Katherine Kelly Vidal
*Director of the United States Patent and Trademark Office*